United States Patent [19]

Cook et al.

[11] Patent Number: 6,006,025
[45] Date of Patent: Dec. 21, 1999

[54] METHOD OF CLOCK ROUTING FOR SEMICONDUCTOR CHIPS

[75] Inventors: Peter William Cook, Mount Kisco; Phillip John Restle, Katonah, both of N.Y.

[73] Assignee: International Business Machines Corporation, Armonk, N.Y.

[21] Appl. No.: 08/934,995

[22] Filed: Sep. 22, 1997

Related U.S. Application Data

[60] Provisional application No. 60/032,216, Dec. 3, 1996.
[51] Int. Cl.$^6$ .................................................. G06F 15/00
[52] U.S. Cl. .................................... 395/500.15; 713/503
[58] Field of Search .................. 713/503; 364/488–491; 395/500.13–500.15; 438/129

[56] References Cited

U.S. PATENT DOCUMENTS

| | | | |
|---|---|---|---|
| 5,410,491 | 4/1995 | Minami | 364/491 |
| 5,784,600 | 7/1999 | Doreswamy et al. | 364/491 |
| 5,838,581 | 11/1998 | Kuroda | 713/503 |
| 5,849,610 | 12/1998 | Zlu | 364/491 X |

Primary Examiner—Thomas M. Heckler
Attorney, Agent, or Firm—F. Chau & Associates, LLP

[57] ABSTRACT

A method of wire routing includes the steps of providing an array of cells on a semiconductor chip, determining a minimum distance location between a first clock point, an second clock point and a drive point for connecting to a connection point in the array of cells, and defining a wire path through an array of blockages disposed in the array of cells from the minimum distance location to the first clock point and from the minimum distance location to the second clock point to create a path for a wire for connecting the first clock point and the second clock point to a connection point such that skew is minimized between the starting clock point and the second clock point from the connection point when a clock signal is provided to the connection point from the drive point.

15 Claims, 9 Drawing Sheets

☐ Cell  ☒ Blocked Cell

☐ Cell  ☒ Blocked Cell  ☐ n  Reached cell at distance n

Fig. 10

| Rows ↓ | | | | | | | | | | | |
|---|---|---|---|---|---|---|---|---|---|---|---|
| 10 | 15 | 14 | 13 | 12 | 11 | C2 | 9 | 8 | 7 | 6 | 5 |
| 9 | 14 | 13 | 12 | 11 | 10 | 9 | 8 | 7 | 6 | 5 | 4 |
| 8 | 13 | 12 | 11 | 10 | 9 | 8 | 7 | 6 | 5 | 4 | 3 |
| 7 | 12 | 11 | 10 | 9 | ✕ | ✕ | ✕ | 5 | 4 | 3 | 2 |
| 6 | 11 | 10 | 9 | 8 | ✕ | 6 | ✕ | 4 | 3 | 2 | 1 |
| 5 | 10 | 9 | 8 | 7 | ✕ | 5 | ✕ | 3 | 2 | 1 | G |
| 4 | 11 | 10 | 9 | 8 | ✕ | 6 | ✕ | 4 | 3 | 2 | 1 |
| 3 | 12 | 11 | 10 | 9 | ✕ | ✕ | ✕ | 5 | 4 | 3 | 2 |
| 2 | 13 | 12 | 11 | 10 | 9 | 8 | 7 | 6 | 5 | 4 | 3 |
| 1 | 14 | 13 | 12 | 11 | 10 | 9 | 8 | 7 | 6 | 5 | 4 |
| 0 | 15 | 14 | 13 | 12 | 11 | C1 | 9 | 8 | 7 | 6 | 5 |
| | 0 | 1 | 2 | 3 | 4 | 5 | 6 | 7 | 8 | 9 | 10 ← Columns |

100

☐ Cell   ⊠ Blocked Cell   [n] Reached cell at distance n

Fig. 11

| Rows ↓ | | | | | | | | | | | |
|---|---|---|---|---|---|---|---|---|---|---|---|
| 10 | 35 | 32 | 29 | 26 | 25 | C2 | 23 | 22 | 23 | 24 | 25 |
| 9 | 34 | 31 | 28 | 25 | 24 | 23 | 22 | 21 | 22 | 23 | 24 |
| 8 | 33 | 30 | 27 | 24 | 23 | 22 | 21 | 20 | 21 | 22 | 23 |
| 7 | 32 | 29 | 26 | 23 | ✕ | ✕ | ✕ | 19 | 20 | 21 | 22 |
| 6 | 31 | 28 | 25 | 22 | ✕ | | ✕ | 18 | 19 | 20 | 21 |
| 5 | 30 | 27 | 24 | 21 | ✕ | | ✕ | 17 | 18 | 19 | G |
| 4 | 31 | 28 | 25 | 22 | ✕ | | ✕ | 18 | 19 | 20 | 21 |
| 3 | 32 | 29 | 26 | 23 | ✕ | ✕ | ✕ | 19 | 20 | 21 | 22 |
| 2 | 33 | 30 | 27 | 24 | 23 | 22 | 21 | 20 | 21 | 22 | 23 |
| 1 | 34 | 31 | 28 | 25 | 24 | 23 | 22 | 21 | 22 | 23 | 24 |
| 0 | 35 | 32 | 29 | 26 | 25 | C1 | 23 | 22 | 23 | 24 | 25 |
| | 0 | 1 | 2 | 3 | 4 | 5 | 6 | 7 | 8 | 9 | 10 ← Columns |

100

☐ Cell   ⊠ Blocked Cell   [n] Reached cell at distance n

☐ Cell  ☒ Blocked Cell  [n] Reached cell at distance n

☐ Cell  ☒ Blocked Cell  [n] Reached cell at distance n

METHOD OF CLOCK ROUTING FOR SEMICONDUCTOR CHIPS

CROSS REFERENCE TO RELATED APPLICATION

This application claims priority to Provisional Application Ser. No. 60/032,216 filed Dec. 3, 1996. Provisional Application Ser. No. 60/032,216 is incorporated herein by reference.

BACKGROUND OF THE INVENTION

1. Field of the Invention

This disclosure relates to a clock router for semiconductor chips and, more particularly, to a balanced clock router with variable width wires to minimize skew.

2. Description of the Related Art

As the performance of microprocessors increases, it is essential to improve the design of clocks and their distribution on a chip to minimize skew. Clock skew can be defined simply as the difference in arrival time of clock signals at different points on a chip. Clock wiring is becoming increasingly critical in high performance chip design. As technology advances, chips are becoming larger as line width are becoming smaller and circuit delays are dropping. This results in the clock signal delay becoming a larger fraction of machine cycle time. Skew is also becoming a larger fraction of machine cycle time.

A possible clock network can be built as an "H-tree". The central assumption underlying the H-tree is that clock points all present the same load and that they are uniformly distributed throughout the chip. While these assumptions are never met completely in real chips, the resulting tree demonstrates some of the properties of more realistic clock networks.

Referring to FIG. 1, the development of an H-tree is shown. Clock points (not shown) of uniform capacitance are assumed to be uniformly distributed throughout the area of a chip 10. On the basis of this assumed symmetry, it is appropriate to provide a drive point 14 for a clock system 16 at the center of the chip as indicated by a dot. This will balance delays along wires 20 to the right and left, since spanned distances are equal. Clock system 16 will still present a substantial amount of skew, however. Actual clock points (not shown) of chip 10 are wired by conventional means to the nearest end point of clock system 16. End points 12 will in some cases be very close to clock points and some a significant distance away. When wired by conventional means (which minimizes the total amount of wiring used), clock points near end points 12 will see less delay than those far away. In the extreme case of a single end point 12 providing a clock signal to both the nearest clock point and the furthest clock point in a given quadrant, the difference in distance between extreme clock points is one quarter the perimeter of the chip.

The situation may be improved by subdividing each quadrant of FIG. 1 into quarter-quadrants, and replicating, at appropriately reduced size, the H-tree wiring pattern in each quarter-quadrant as illustrated in FIG. 2. The maximum range in distance from actual clock point (not shown) to end points 12 would be half of the value of the distance in FIG. 1. A "two-stage" H-tree may still result in excessive skew. The process of quartering the smallest region served by each end point 12 of a given H tree and providing an additional "H" within this smaller region may be continued to produce a "multi-stage" H-tree as illustrated in FIG. 3

FIG. 3 is a 4-stage H-tree that divides the chip into 256 small regions, each with an edge that is 1/16 the originally chip edge. Because wiring to actual clock points 12 in chip 10 is completed only from the end of the last stage of H's, the variability in wire length has been reduced by a factor of eight. Hence the variability in delay from the central feed point of the entire chip to any final clock point has been similarly reduced.

Note that the total length of wire in the H-tree increases by (w/2)+h each time a stage is added. If enough stages are added, the capacitance implied in the wires may become significant compared to the clock loads being driven. In this case, adding more stages will significantly slow down the waveform at the end of the tree. It is not sufficient to provide only balanced delays in a robust clock network. In addition, waveforms must remain reasonably fast in their switching. Practically, this implies that in an H-tree as is illustrated in FIGS. 1, 2 and 3, wires that are closer to the central drive point 14 of the entire network will have to be wider than those at the load end (clock point 12) of the tree. It may in fact be necessary to provide a level of buffer circuit at some point within the tree to provide waveforms that are adequately fast in their transition times to be useable as clocks at the load ends.

Note again that the fully symmetrical H-tree assumes that clock loads are uniformly distributed throughout the chip, and that it is possible to provide the tree at the exactly desired location. Neither of these assumptions is met in practice. Integrated circuit chips have clock loads that offer non-uniform capacitance, and that are clustered in some areas of the chip and totally absent from others. In addition, the need to provide signal wiring can lead to some regions of the chip being unusable by clock wiring, so that the symmetrical tree may not be possible even if a chip were to have uniformly distributed clock loads. Nevertheless, the general principles of providing balanced delay to small sections of a chip and wire widths that increase as one moves from the load points to the drive point apply in practical realistic clock networks.

A variety of algorithms exist for performing general wiring of integrated circuit chips. The problem to be solved by all of these is generally to connect two or more points using the wiring levels allowed by the semiconductor process without violating design rules, and without erroneously connecting wires that are intended to remain unconnected.

One useful algorithm for performing such routing is the Lee Maze Runner algorithm, whose basic operation is illustrated in FIGS. 4 and 5. In the Maze Runner algorithm, the area of interest is seen as a rectangular grid of cells 22, each of which can accommodate a wire (not shown). The physical rectangle corresponding to a cell 22 is set so that the cell can fit a legal wire and its space. Points to be connected are mapped into cells 22 by position. The next step is finding a path from a starting cell 24 containing a start of a wire to the cell (or cells) containing an ending point 26 (or points) to complete the connection thereto. Pre-existing wires, or wires already made, block the paths of wires that need to be routed through the cells, making them unusable for the current connection being wired.

A typical situation is that illustrated in FIG. 4 which shows the array of cells 22, with the starting cell 24 for a desired wire 26 in the lower left corner, and the ending (or "target") cell 26 for a wire (not shown) in the upper right. Blocked cells 28 are disposed within array of cells 22 either due to prior wiring, or to reserve space that is wire-free.

The Maze Runner stores that information associated with such a situation as (typically) an array of data structures, each of which contains blockage information, and also a "distance" measure, which reflects the distance of the corresponding cell from starting cell 24 for a wire. Initially, this distance is set to some normally illegal value (such as −1) to represent "undefined", and the distance of the starting cell is set to 0. Information specifying which cell 22 is start cell 24 of the wire and which cell 22 (or cells) is (or are) ending or target cell(s) 26 may be kept in the cell data structure or in a separate data structure.

Referring now to FIG. 5, the Maze Runner proceeds in two distinct phases. The first, propagation, determines all cells that can be legally reached from paths starting at the starting cell, and, in addition, determines the shortest distance (in cells) to each such reachable cell. This is shown in FIG. 5 by the numbers in each cell which represent the distance from starting point 24. The second, back tracking, uses the distance measures determined in propagation to develop the actual path between start and target cells. The backtracked path is indicated by a desired wire path 30.

The propagation phase of the Maze Runner is very simple, and proceeds as follows:

A. Set a "change counter" to zero
B. For each cell 22 in the array:
  a. If the cell is a blocked cell 28, skip to the next cell.
  b. If the cell has undefined distance, skip to the next cell.
  c. Compute the distance of the cell location from starting cell 24 location (dd=distance+1)
  d. Examine all cells N that are adjacent to cell 22:
    I. If distance (N) is undefined, set distance (N)=dd, and increment change counter
    ii. If distance (N) is defined and exceeds dd, set distance (N)=dd, and increment change counter.
C. When all cells 22 have been processed, examine the change counter. If it exceeds zero, return to step A; if is it 0, begin back-trace.

Note that this is guaranteed to stop, and further, will determine all cells reachable from starting cell 24.

The back track phase of the Maze Runner is similarly simple, and proceeds as follows:

A. Beginning at cell C corresponding to ending cell 26.
B. Mark cell C indicating that it is on the wire path desired.
C. If the cell C is starting cell 24, exit.
D. Look at all cells N that are immediately adjacent to each cell C.
  a: If distance (N)<distance (C), set C to N, and proceed to step B. If more than one neighbor N meets the above condition, pick the one which continues cell-to-cell "movement" in the same direction as the prior "move"; if there is no prior "move", pick a direction arbitrarily.

Possible results of the back track phase are illustrated in FIG. 5 as desired wire 30.

The Maze Runner algorithm above has been illustrated in a two dimensional context. The typical integrated circuit application of the algorithm is three dimensional, as several "layers" of wiring are typically provided by contemporary technologies. The same basic notions apply, however. In addition, in the three dimensional case, it is possible to achieve certain special results: one might, for example, restrict different layers of wiring to a single X or Y direction only, or, by modifying the concept of distance, might make a give layer mostly X or Y direction, while allowing small "jogs" in the non-preferred direction. Such changes might require minor modification to the back trace phase of the algorithm.

The basic Maze Runner is not directly applicable to clock wiring as it is always attempting to minimize wire length, and has no notion of timing within. It also typically deals with wires of one constant width. Consequently, a need exists for efficient clock routing tools in which wiring distance, power dissipation, delay and skew are all allowed for and optimized. For reasonable delays, such tools further need to be able to accommodate wires some of whose width may be 20–50 (or more) times the width or minimum width wires, while also including some minimum width wires as well. Finally, such tools must be able to set wire widths over a very broad range to accommodate fine tuning of optimized parameters.

SUMMARY OF THE INVENTION

A method of wire routing includes the steps of providing an array of cells on a semiconductor chip, determining a minimum distance location between a first clock point, an second clock point and a drive point for connecting to a connection point in the array of cells, and defining a wire path through an array of blockages disposed in the array of cells from the minimum distance location to the first clock point and from the minimum distance location to the second clock point to create a path for a wire for connecting the first clock point and the second clock point to a connection point such that skew is minimized between the starting clock point and the second clock point from the connection point when a clock signal is provided to the connection point from the drive point.

In particularly preferred embodiments, adjusting the wire for maximizing balance between load and delay between the first clock point and the second clock point is included. The first clock point and the second clock point may include a plurality of clock points and further comprising the step of reducing the number of clock points on the chip by combining the clock points into equivalent clock points. Calculating the distances, delay and load at each cell within the array of cells during the routing of the wire path can be included. Also, the drive point may be located for biasing the location of the wire path.

In other embodiments, the step of determining a minimum distance location between a first clock point, an second clock point and a drive point in the array of cells further comprises pairing the first clock point and the second clock point based on substantially equivalent delay and physical proximity therebetween, counting a first number of cells from the first clock point to the second clock point and a second number of cells from the second clock point to the first clock point assigning each cell a first number representing the first number of cells from the first clock point and a second number representing the second number of cells from the second clock point. The steps of selecting the drive point in the array of cells such that a wire path is biased toward the drive point within the array of cells, counting a third number of cells for each cell representing a third number for each cell for a distance to both the first clock point and the second clock point from the drive point are also included. Further, summing the first number, the second number and the third number for each cell to determine a fourth number for each cell and identifying a minimum distance location based on the cell having the fourth number of lowest value are used to determine the minimum distance location.

In another embodiment, the step of defining a wire path through an array of blockages further comprises the steps of defining and adjusting a wire path to avoid blockages in the array of cells, the wire path distance being minimized between the first clock point and the second clock point and from the connection point to the drive point, determining a delay and a load at each cell in the wire path, moving the connection point on the wire path such that delay and load are substantially equal from the connection point to the first clock point and from the connection point to the second clock point, connecting the first clock point to the second clock point through the connection point with a wire and electrically connecting the connection point to a predetermined drive point such that skew is minimized between the starting clock point and the second clock point from the connection point when a clock signal is provided at the drive point.

BRIEF DESCRIPTION OF DRAWINGS

The invention will be described in detail in the following description of preferred embodiments with reference to the following figures wherein:

FIG. 10 is a plan view of a semiconductor chip showing distances from a drive point to a starting point and an ending point in each cell;

FIG. 11 is a plan view of a semiconductor chip showing the sum of the distances from the numbers of FIGS. 7, 8 and 10.

DETAILED DESCRIPTION OF PREFERRED EMBODIMENTS

Figure 1:
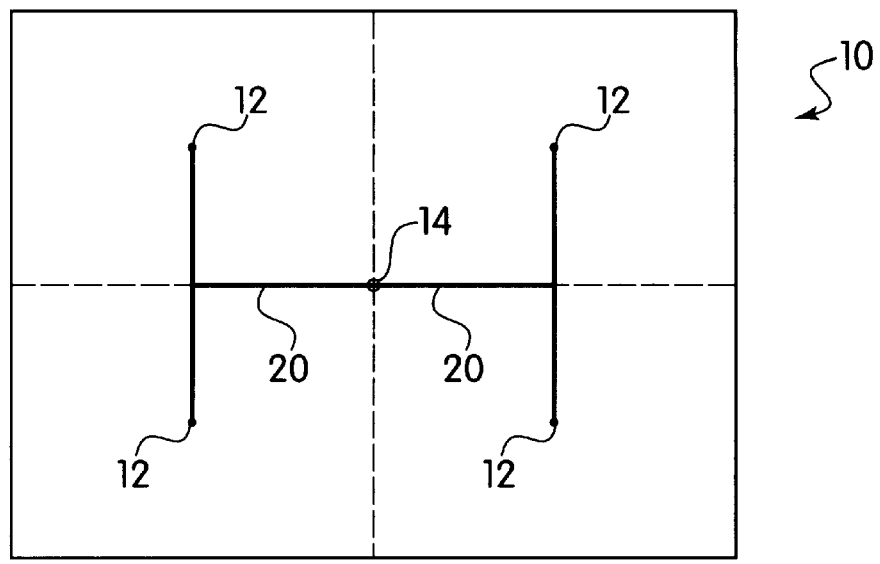
FIG. 1 is a prior art plan view of a semiconductor chip divided into four quadrants and showing an H-tree clock network.
Figure 2:
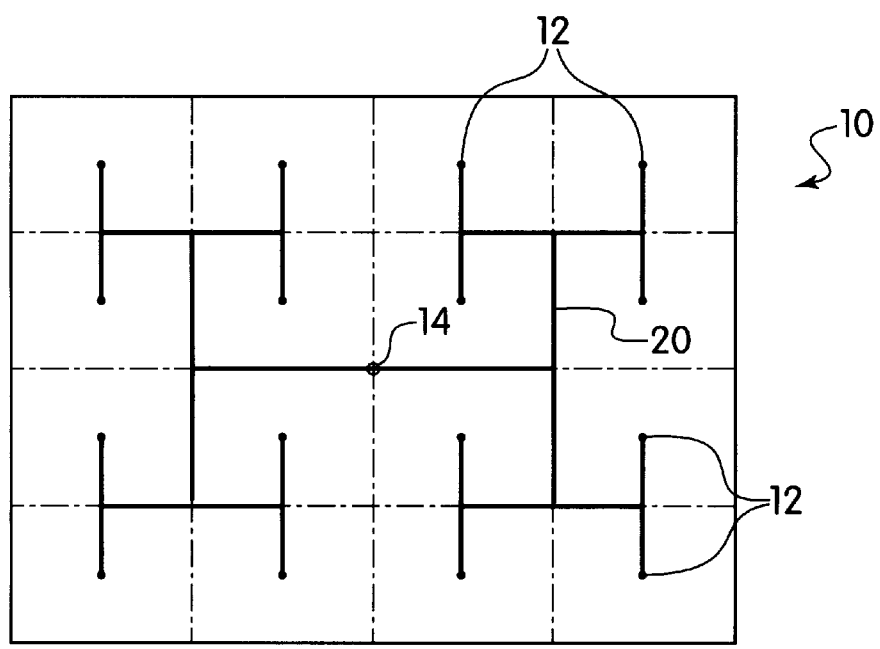
FIG. 2 is a prior art plan view of a semiconductor chip divided into 16 regions and showing an H-tree clock network.
Figure 3:
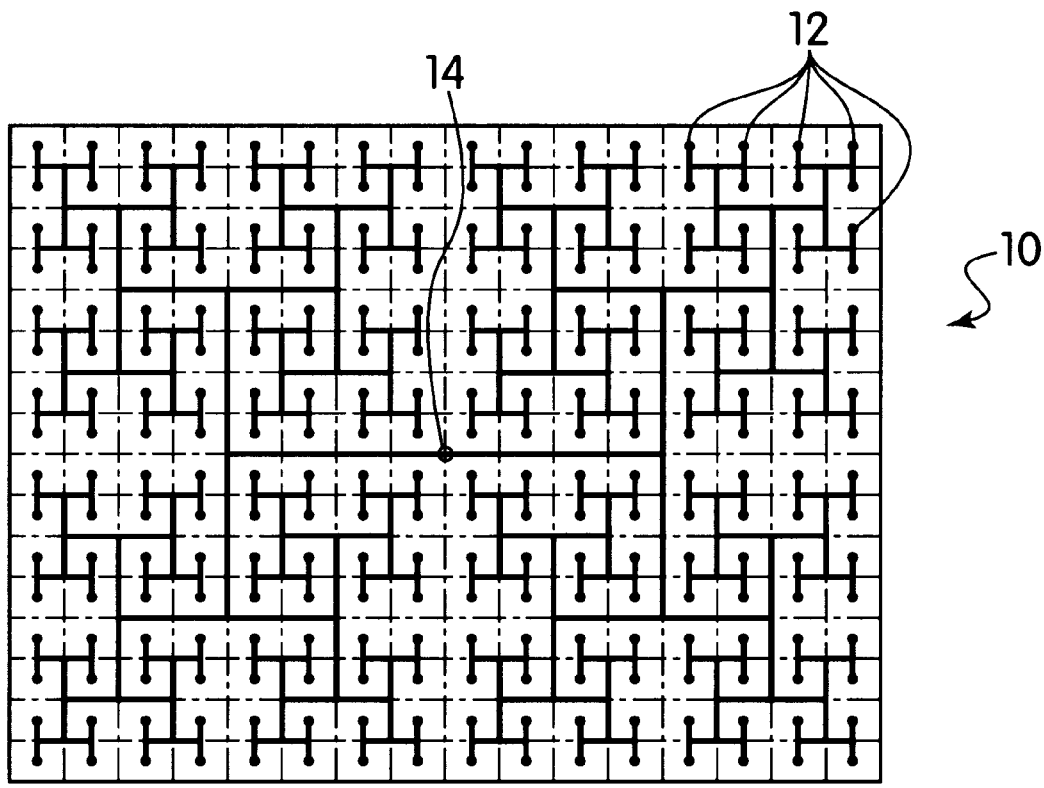
FIG. 3 is a prior art plan view of a semiconductor chip divided into 256 regions and showing an H-tree clock network.
Figure 4:
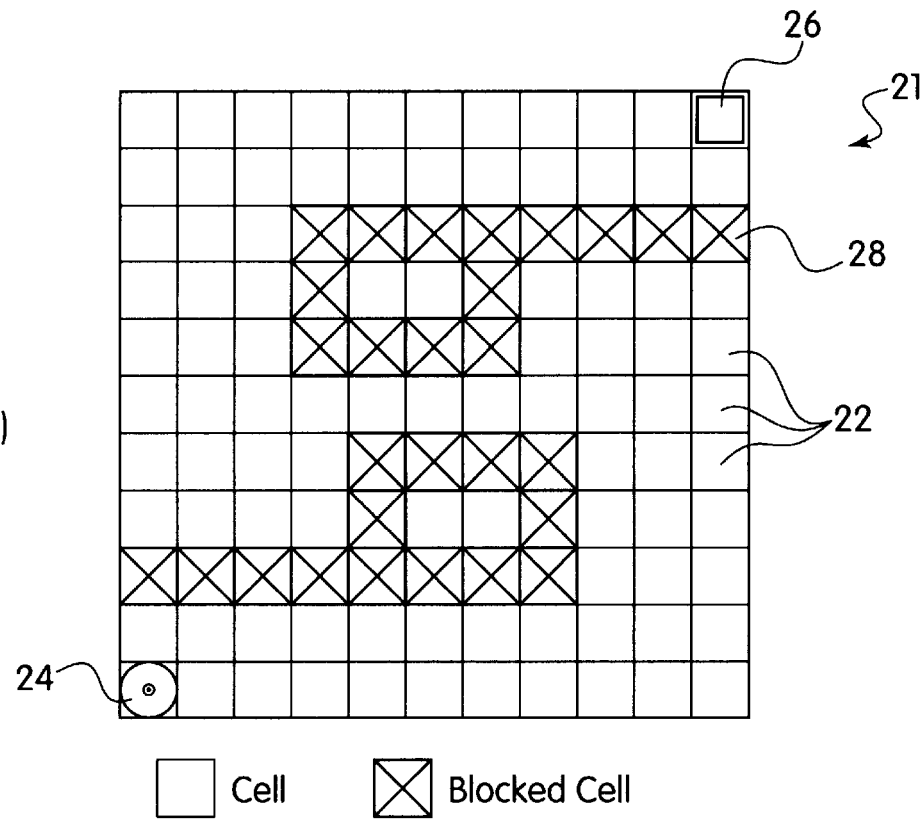
FIG. 4 is a prior art plan view of a semiconductor chip having blocked cells.
Figure 5:
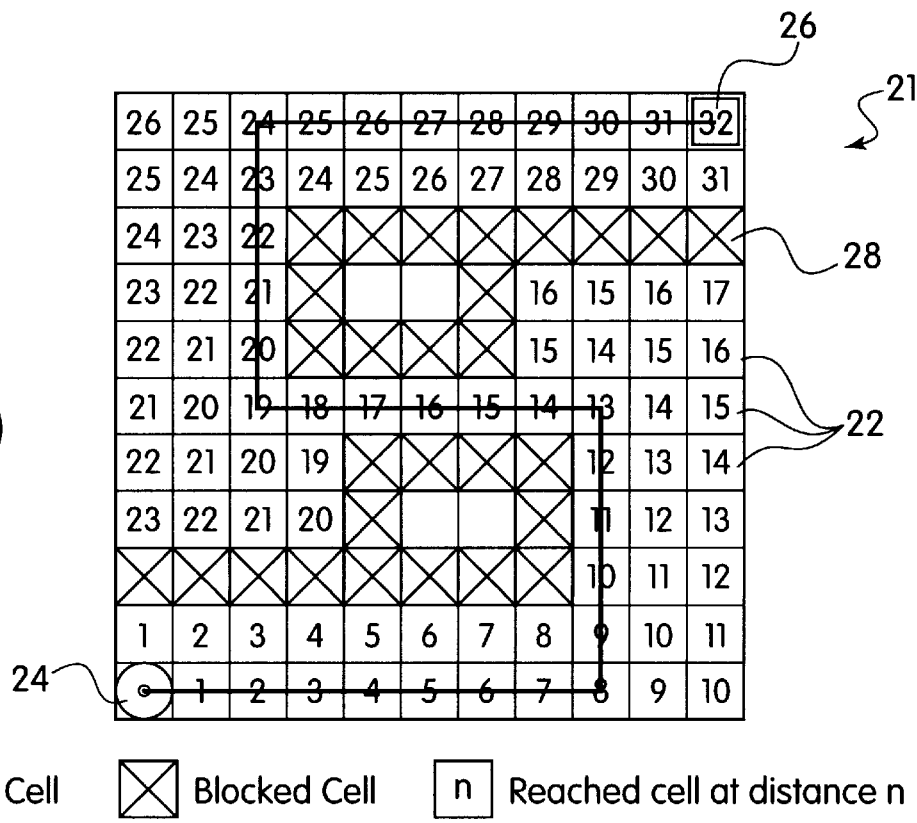
FIG. 5 is a prior art plan view of a semiconductor chip showing a wire path generated by a prior art maze running algorithm.

The present disclosure describes a clock routing method for routing a clock network for semiconductor chips. The clock router includes wire delay as it routes, leading to reduced skew, delay and power dissipation. The clock network synthesis interconnects a set of "clock points" in an integrated circuit chip into a single network with a single drive point in such a way as to minimize the skew among the used clocks in the chip, while maintaining fast transition times at the clock points. There is a difference between "clock points" and "used clocks." Contemporary microprocessor integrated circuit chips may use "registers" of 64 bits. It is not necessary or even desirable to create a clock network that reaches each bit of each register. Rather, each register is typically provided with some extra circuitry (often called a "clock block") which accepts the clock waveform from the clock network, re-shapes and buffers it, and delivers it to each bit of the register. The output from this clock block is a "used clock" of the entire chip. The input to the clock block is typically one of the clock points serviced by the clock network. From a skew perspective the use of such a clock block is acceptable because the wire delays introduced at this level are very small. But the clock block does introduce some delay between the switching at the clock point and the corresponding used clock, and this delay may vary from one clock block to another. This variation in delay is allowed for in setting the timing at the clock points.

It is possible to characterize clock points to be connected by several parameters:

A. A position on a surface of a chip, possibly including wiring level positions in addition to the surface of the chip.

B. A capacitive load.

C. A delay from the "clock point" to the corresponding "used clock."

A realistic microprocessor may have on the order of 1000 clock points, non-uniformly distributed over the surface of the chip, and with varying load and delay characteristics.

The method described herein addresses creating low-skew clock networks while considering the above listed parameters. Referring now in specific detail to the drawings in which like reference numerals identify similar or identical elements throughout the several views, and initially to FIG. 6, a grid is formed on a chip 100, similar to the Maze Runner described above. However, if the grid includes cells C as small as a minimum sized wire, the full chip may involve 100 million cells for a typical semiconductor chip, which is an inordinately large number; further, complications arise in providing wires that are significantly larger than the minimum width allowed. This requirement will arise in clock networks. Therefore, the grid used may divide the chip surface into cells that span a number of minimum wire sizes. Since each cell may now contain more than one clock point, it is necessary to cluster all clock points within a single cell to a single "equivalent" clock point. The equivalent clock point has as its load the sum of the load on all real clock points within the cell. The equivalent clock point has as its delay the average of the delays of all real clock points within the cell, and the equivalent clock point has as its position the center of the cell. (Note that wiring between the "equivalent" clock point and real clock point (s) within a cell will be provided by conventional wiring tools; the size of the cell thus must be kept small enough so that the skew introduced at this level is acceptable for clock wire routing.).

Reference to cells hereinafter will apply to both actual clock points and also equivalent clock points which contain a plurality of clock points but will be considered a single clock point having the characteristics as mentioned above. An "ideal" wiring of the clock network to the equivalent clock points is formed. "Ideal" means that the clock network is generated as if there were no blockages in the chip, and wires may cross freely without connecting, the only connection between wires being at their extreme ends. Note that neither of these situations is realistic. In reality, chip wiring may already have power wires defined, and other areas may be known to exclude wiring for a variety of reasons. In integrated circuits, wires (on a given wiring level) will connect wherever contact is made between the wires, not just at end points. While "ideal" wiring is not true, it results in a wire pattern that will guide the real detailed wiring which follows.

The ideal wiring is created from the bottom up. A pair of equivalent clock points is selected on the basis of delay and physical proximity. Each such pair of points is connected by a simple wiring pattern, and the balance point in the pattern (at which the sums of clock point delay and wire delay are equal from balance point to each clock point) are located. These balance points become the new equivalent clock points for the next level of combination; the load for these new equivalent clock points is the sum of the load at each equivalent clock point of the pattern plus the capacitance of the wiring of the pattern. The delay associated with the new equivalent clock point is the delay of the pair of equivalent clock points in the pattern plus the estimated delay along the wiring from the new equivalent clock point to the original equivalent clock points at the pattern's end.

This method typically takes two equivalent clock points and reduces them to a single new equivalent clock point. Thus each major step in this algorithm divides the number of remaining unwired equivalent clock points by a factor of two, although the effective factor will be less if the original number of clock points is not an exact power of 2. At each major step the wire width is increased to allow for the growing total load being driven from the new balance points. This process continues until there is only one equivalent clock point. This is the balance point for the entire "ideal" clock network. While this "ideal" network is based on assumptions that are not fully valid, it results in a network, that has all physical characteristics fully defined.

Figure 6:
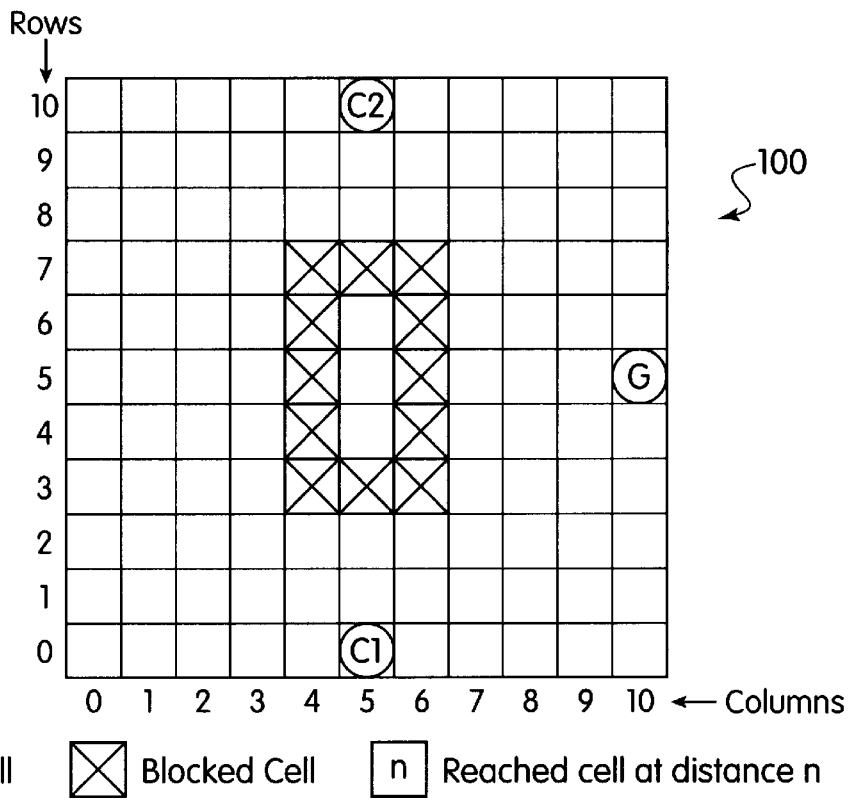
FIG. 6 is a plan view of a semiconductor chip showing blocked cells.

The location, capacitance and time data for each cell is grouped into what are termed "ties" which specify four nodes. The four nodes in a tie are designated as C1, C2, P and G, where C1 and C2 are the equivalent clock points to be joined at P. G is the node to which P will be connected at the next level of clock points after all the clock points at the present level are joined. Note that a "tie" reflects one pair-wise joining of clock points. The characteristics (position, delay and load) of C1 and C2 are precisely specified, while those of P and G are estimates, based upon the results of "ideal" wiring. The significance of the tie (C1, C2, P, G) is to connect C1 to C2 at P heading for G, such that the delay from P to C1 is identical to that from P to C2. P will be assigned a precise location. An example of the locations of C1, C2 and G is shown in FIG. 6.

An extensively modified Maze Runner is used to route the wire path. As a preparation, the Maze Runner creates appropriate tables to represent the area of the chip being processed. It then processes a blockage file that provides information of where wires already exist in the chip, or where area is to be saved for such wires. Since Maze Runner cells are larger than minimum width wire in the usual case, and since it is an intention of the method to allow wide wires to be accommodated, a cell is considered blocked if any pre-existing wire or block area intrudes to any degree into the cell area reserved for wiring. Following this initialization, the Maze Runner begins to process "tie" information in the order obtained from the ideal wiring. This order is generally from the original equivalent clock points up towards the central drive point of the entire clock network.

The Maze Runner keeps track of distances from 3 nodes in the tie: C1, C2 and G. Further, while distances from C1 and C2 are computed allowing for all blockages, the distance computed from G treats blockages as non-existent.

Figure 7:
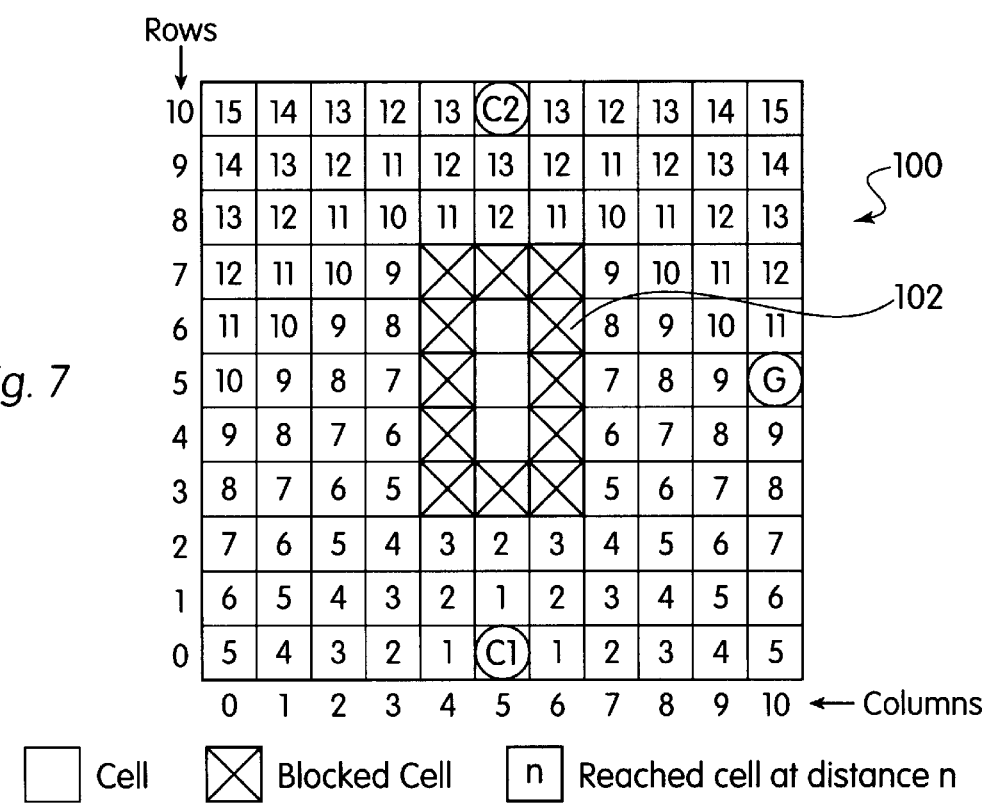
FIG. 7 is a plan view of a semiconductor chip showing distances from a starting point to an ending point in each cell.
Figure 8:
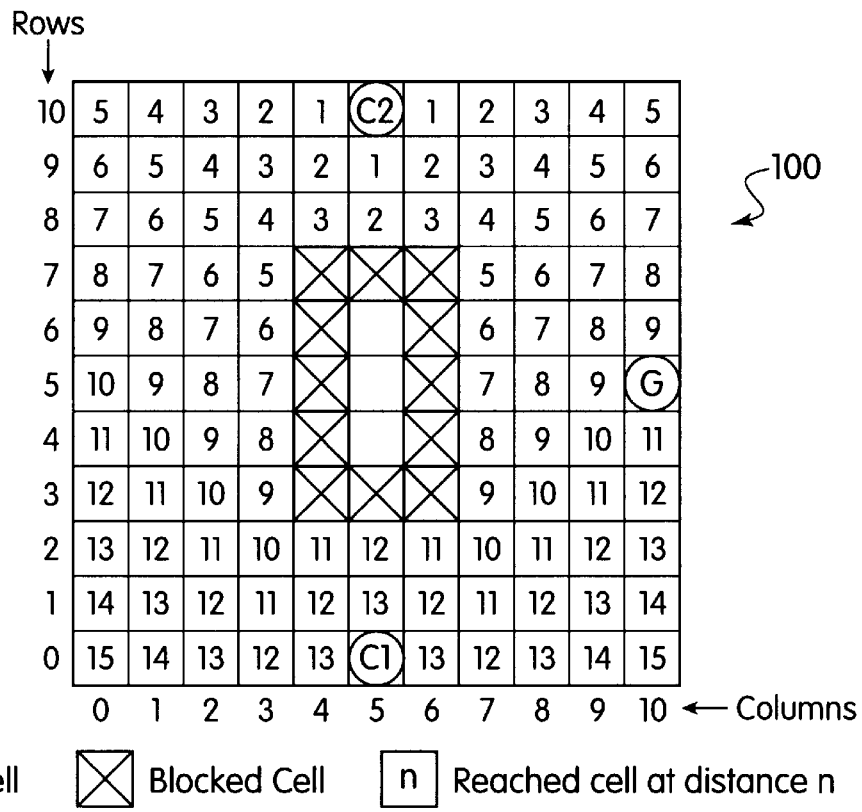
FIG. 8 is a plan view of a semiconductor chip showing distances from an ending point to a starting point in each cell.

Once all three distances are computed, the method selects a cell "X" (not shown) at which the sum of all three distances is minimized. The need for all three distances in determining the wire path between C1 and C2 is illustrated with reference to FIG. 7. FIG. 7 shows distances from C1 in each unblocked cell. A symmetrical pattern is apparent about blocked region 102. FIG. 7 shows the distances (in number of cells) of each cell to C1 from C2 which obviously is also symmetrical due to the symmetry of blockage region 102. It is clear that in back tracking from C2, there is tremendous ambiguity in which direction should be taken. FIG. 8 shows distances from C2, and ambiguity arises since multiple paths may exist between C1 and C2. This reflects a potential problem, as taking a path that leads to the left of the figure will make subsequent wiring to node G more difficult, since G is to the right of both C1 and C2.

Figure 9:
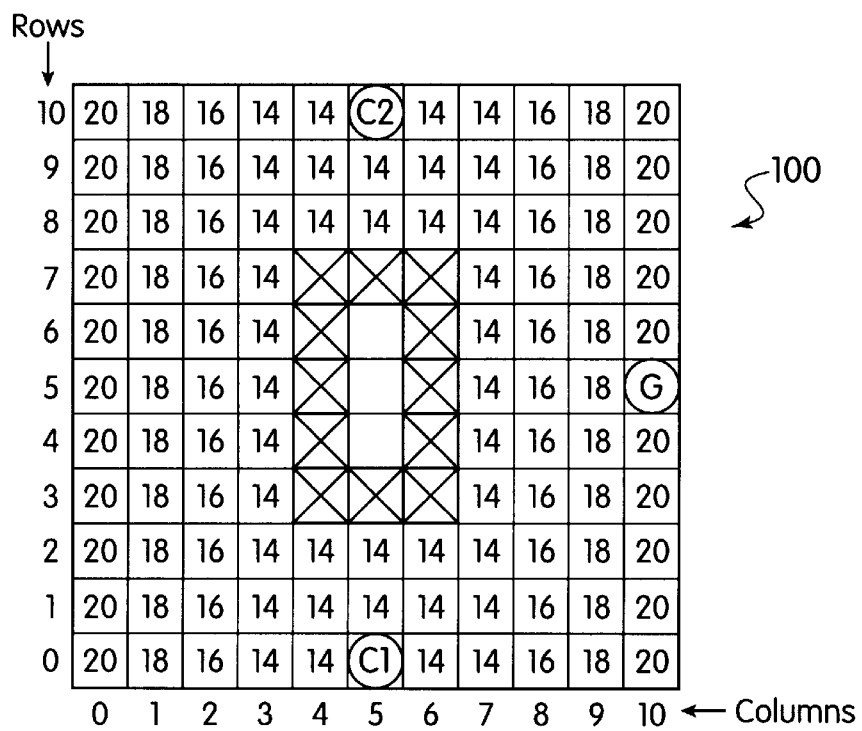
FIG. 9 is a plan view of a semiconductor chip showing the sum of the distances from the numbers of FIGS. 7 and 8.

Referring to FIG. 9, a sum of the distances of each cell from C1 and from C2 is shown as a number in each unblocked cell. The sum of the distances is frequently used to eliminate alternate wire paths. In the case at hand, however, using the sum of distances from C1 and C2 resolves nothing since many cells have equal sums of the distances, as shown in FIGS. 7 and 8.

Referring to FIG. 10, the ambiguity is fully resolved by selecting a starting point for the path between C1 and C2 from the sum of three distances, for example including the distances from G to C1 and G to C2. These distances are indicated within each cell as shown in FIG. 10. These distances can be summed with the distances indicated in FIGS. 7 and 8. This composite distance measure is an indication of the total wire length involved in connecting C1 to C2, and then connecting that pair to G.

Figure 12:
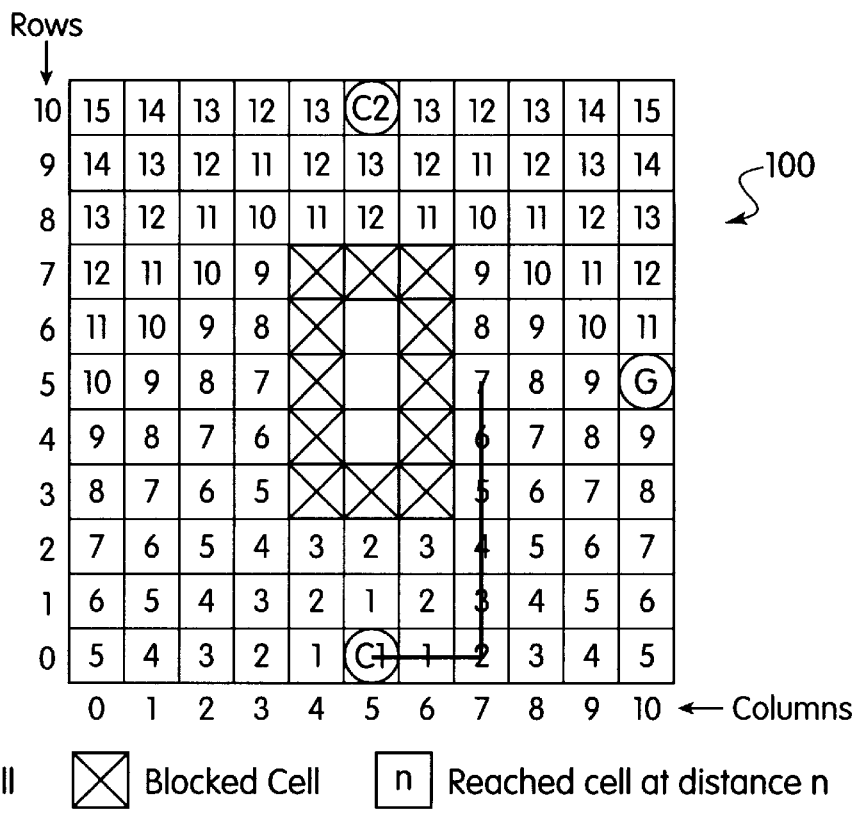
FIG. 12 is a plan view of a semiconductor chip showing a wire path route.
Figure 13:
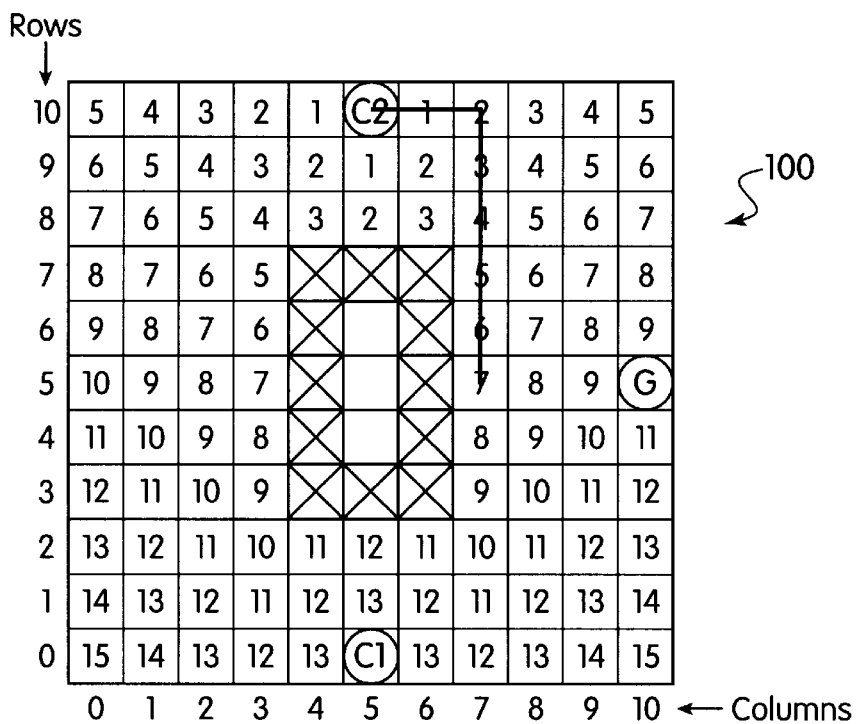
FIG. 13 is a plan view of a semiconductor chip showing a wire path route.
Figure 14:
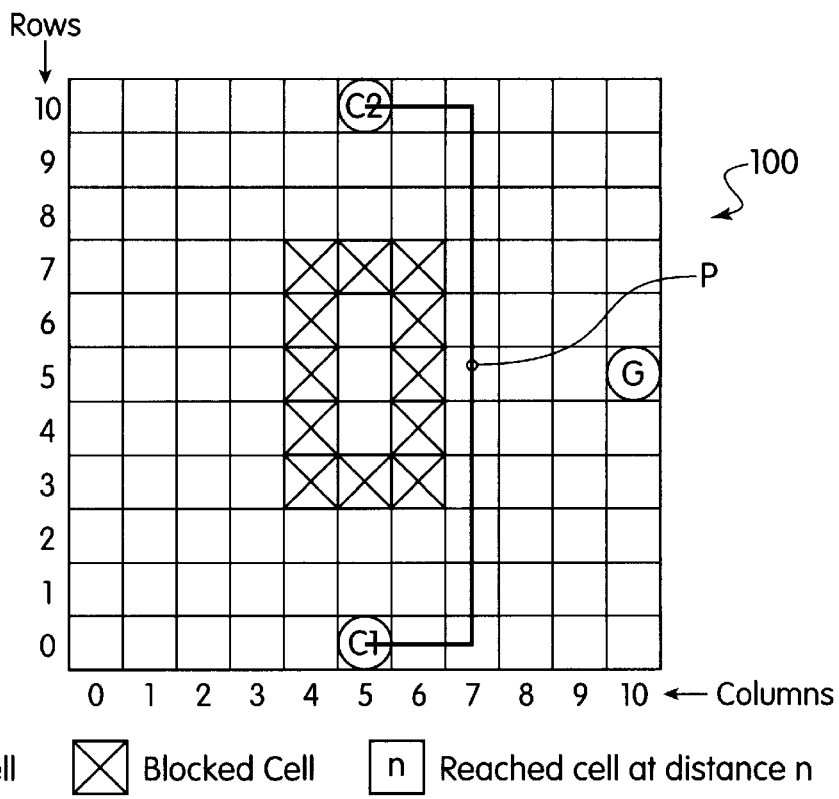
FIG. 14 is a plan view of a semiconductor chip showing the completed wire path.

Referring to FIG. 11, the sum of the distances for the distances from C1 To C2, C2 to C1 And G to C1 and C2 is totaled and indicated by the numbers in each cell. Columns and rows are indicated for easy reference. FIG. 11 the X point can be selected at column 7 row 5 which is the smallest sum of the distances. Back tracking now takes place as illustrated in FIGS. 12 and 13 from X to C1 (using distances from C1) and from X to C2 (using distances from C2). The final wire path is illustrated in FIG. 14.

The selected point X is not necessarily that point P at which the wire from C1 to C2 should be driven: it is merely a point on the wire between C1 and C2. The location of G relative to C1 and C2, and the delay and load properties of C1 and C2 will generally make X and P distinct points on the wire between C1 and C2. To locate P requires additional effort.

The goal of the entire process is to balance delays from P to the used clock points "under" C1, and from P to the used clock points under C2. To accommodate this, the modified maze runner also computes delays while it is computing distances. Thus, as it starts at C1, it has a delay and load associated with C1. When it determines that it is possible to wire from C1 to the cell to the right at column 6 row 0 in FIG. 14, it computes the approximate delay in the wire segment that will connect the cells, using a simple Elmore model of delay, and records in the cell (at column 6 row 0) the total delay (delay at C1 plus delay in wire) and the total load (load at C1 plus load added by wire). This process is done at the same time the distances are computed, so that in addition to distances, the maze data includes estimated delay from each reachable point in the array to both C1 and C2. Thus to select P, the method will step along the path from C1 to C2, and select as P that point for which the delay to C1 is most nearly equal to that to C2. In addition, the point selected for P must have the possibility of a third wire exiting the cell, so that the wire that ties P to G can be routed without colliding with the wires from P to C1 or C2. In FIG. 14, P is shown at the temporarily selected point X (column 7 row 5) since it is that point for which the delay to C1 is most nearly equal to that to C2.

The Maze Runner must accommodate wide wires. Most of the wires are in fact accommodated by the fact that the cell used in the Maze Runner is significantly larger than a minimum wire intersection. However, that may not be wide enough for all wire widths called for in the ideal wiring. Therefore, the Maze Runner actually determines if a move is "feasible" not simply by seeing if the cell to which the move is considered is unblocked, but by seeing if an n by m rectangle of cells centered on the target cell is unblocked. This use of a "moving rectangle" to evaluate legality of all cell to cell moves lets the Maze Runner handle wires that are n cells wide in the x direction, and m cells wide in the y direction. (The numbers n and m may be different to allow for different electrical characteristics of the wires on the levels used to implement the two directions.)

Note that while the example presented in FIGS. 6–14 is two dimensional, the actual Maze Runner works in a three dimensional space, and does in fact reserve one wiring plane for each direction of wire. This leads to only minor extensions to the operation cited above.

Figure 15:
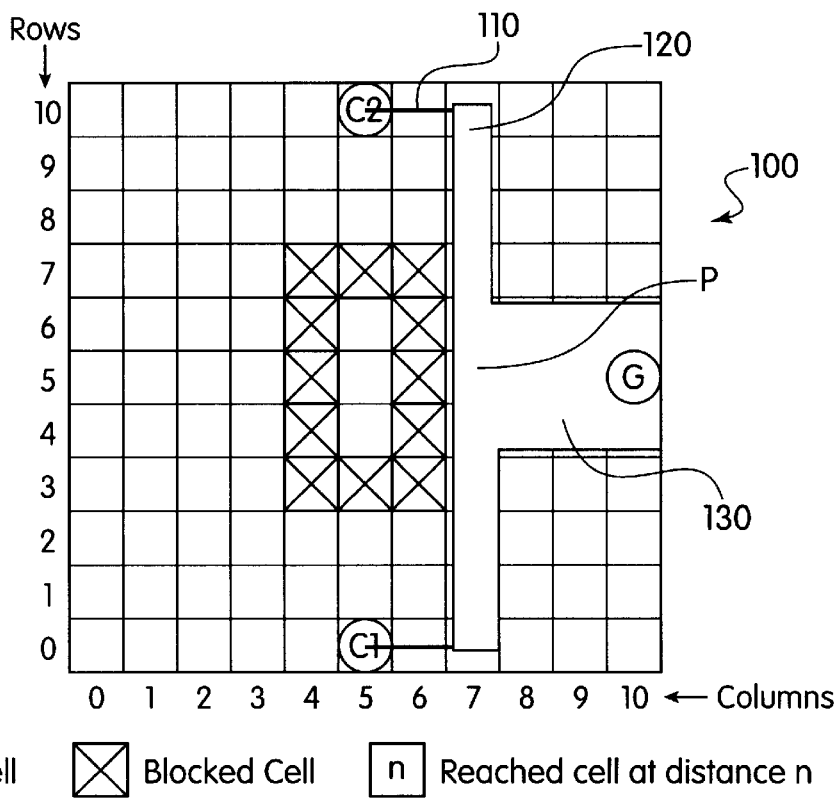
FIG. 15 is a plan view of a semiconductor chip showing a wire with its width adjusted.

Referring now to FIG. 15, when the wire path is assigned, there are some final tuning tasks to perform. These arise from the fact that (1) wire widths used by to this point are estimates, and (2) an Elmore model is used in the process to estimate wire delays. Therefore, the entire network may now passed to a final optimization step, which uses more accurate methods of evaluating wire delays (asymptotic waveform estimation) and now adjusts widths (within limits set by the width of a cell and, for very wide wires, the number of cells in a wire) to fine tune, for example, the skews and resistances due to wiring in the complete network. As illustrated in FIG. 15, it may be determined that a wire 110 extending between C1 and C2 is very narrow, for example the minimum wire width, while wires 120 and 130 between C1, C2 and P and between P and G, respectively can be wider in order to adjust the performance parameters as mentioned above. Wire widths can be varied as needed and although FIG. 15 shows a two dimensional wire, three dimensional wiring is normally performed.

In some instances, it is not necessary or desired to achieve minimum skew in the routing algorithm. In some cases, a relatively small increase in skew can result, for example, in a significant decrease in wiring capacitance and delay of the network. This can be especially important when wiring tracks or power are constrained. In addition, the final wire width tuning process can eliminate skew resulting from the low-skew algorithm. For these reasons, instead of using minimum skew alone to determine the optimum routing, a more general objective function can reduce, for example, wire delays, wiring tracks, wiring capacitance and sensitivity to process variations as well as skew. Since the maze propagation algorithm calculates these parameters anyway, this generalization requires little additional effort. The final wire tuning process can also include a generalized objective function including total wire delays, wiring tracks, wiring capacitance and sensitivity to process variations as well as skew.

The final step consists of wiring from the end points of the clock network produced above to the real clock points within each cell. This is done by conventional routing tools, as the wire width at this point in the tree is always minimum, and the skew introduced in this step is low due to the small size of the cells. For very critical applications, it is possible to compute the delay introduced by these wires, add that to the delay associated with the corresponding clock points, and re-tune wire widths to compensate.

Figure 16:
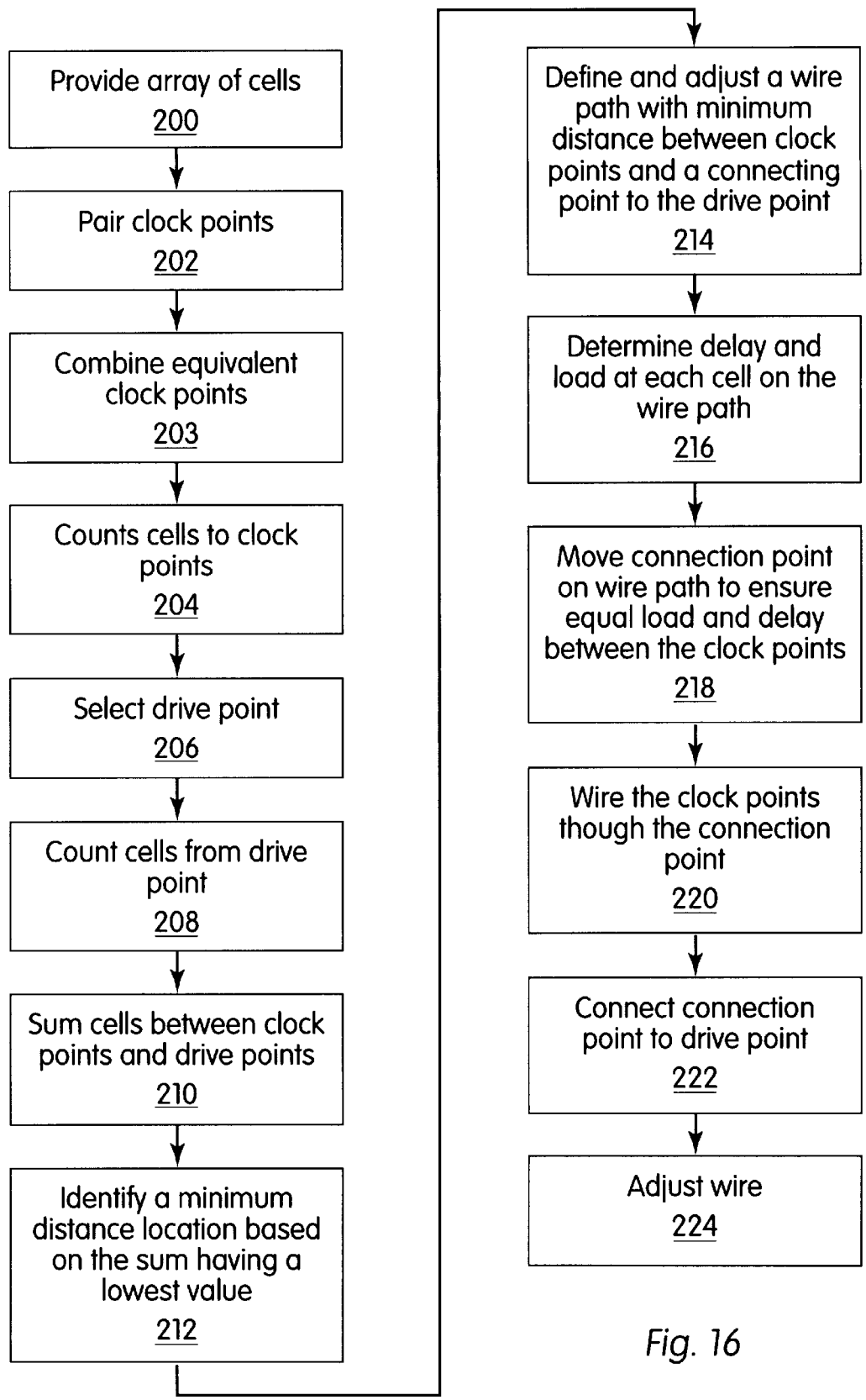
FIG. 16 is a flow diagram of a method for clock routing in accordance with the present invention.

Referring to FIG. 16, a flow diagram for a method of wire routing in accordance with the present invention is shown. The method includes the step of providing an array of cells on a semiconductor chip in block 200. Clock points are paired, in block 202, based on a substantially equivalent delay and physical proximity therebetween. In block 203 equivalent clock points may be combined to reduce the number of clock points. Illustratively, in block 204, a first number of cells from a first clock point to a second clock point are counted, and a second number of cells from the second clock point to the first clock point are counted assigning each cell a first number representing the first number of cells from the first clock point and a second number representing the second number of cells from the second clock point. In block 206, a drive point is selected in the array of cells such that a wire path is biased toward a predetermined drive point disposed within the array of cells. A third number of cells is counted, in block 208, representing a third number for a distance to both the first clock point and the second clock point from the drive point. In block 210, the first number, the second number and the third number are summed for each cell to determine a fourth number for each cell. A minimum distance location is identified based on the cell having the fourth number of lowest value, in block 212. In block 214, a wire path is defined and adjusted to avoid blockages in the array of cells. The wire path distance is minimized between the first clock point and the second clock point and from a connection point to the drive point. In block 216, a delay and a load at each cell in the wire path is determined. The connection point is moved on the wire path such that delay and load are substantially equal from the connection point to the first clock point and from the connection point to the second clock point, in block 218. The first clock point is connected to the second clock point through the connection point with a wire, in block 220. In block 222, the connection point is electrically connected to the predetermined drive point such that skew is minimized between the first clock point and the second clock point from the connection point when a clock signal is provided at the predetermined drive point. In block 224, the wire may be adjusted for maximizing balance between load and delay between the first clock point and the second clock point.

Having described preferred embodiments of a novel clock router (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method of wire routing comprising the steps of:

providing an array of cells on a semiconductor chip;

determining a minimum distance location between a first clock point, a second clock point and a drive point for connecting to a connection point in the array of cells; and defining a wire path through an array of blockages disposed in the array of cells from the minimum distance location to the first clock point and from the minimum distance location to the second clock point to create the wire path for a wire for connecting the first clock point and the second clock point to the connection point such that skew is minimized between the first clock point and the second clock point from the connection point when a clock signal is provided at the connection point from the drive point.

2. The method as recited in claim 1 further comprising the step of adjusting the wire for maximizing balance between load and delay between the first clock point and the second clock point.

3. The method as recited in claim 1 wherein the first clock point and the second clock point include a plurality of clock points and further comprising the step of reducing the number of clock points on the chip by combining the clock points into equivalent clock points.

4. The method as recited in claim 1 further comprises the step of calculating the distances, delay and load at each cell within the array of cells.

5. The method as recited in claim 1 further comprises the step of locating the drive point for biasing the location of the wire path.

6. The method as recited in claim 1 wherein the step of determining a minimum distance location between a first clock point, a second clock point and a drive point in the array of cells further comprises the steps of:

pairing the first clock point and the second clock point based on substantially equivalent delay and physical proximity therebetween;

counting a first number of cells from the first clock point to the second clock point and a second number of cells from the second clock point to the first clock point assigning each cell a first number representing the first number of cells from the first clock point and a second number representing the second number of cells from the second clock point;

selecting the drive point in the array of cells such that a wire path is biased toward the drive point within the array of cells;

counting a third number of cells for each cell representing a third number for each cell for a distance to both the first clock point and the second clock point from the drive point;

summing the first number, the second number and the third number for each cell to determine a fourth number for each cell; and identifying a minimum distance location based on the cell having the fourth number of lowest value.

7. The method as recited in claim 1 wherein the step of defining a wire path through an array of blockages further comprises the steps of:

defining and adjusting a wire path to avoid blockages in the array of cells, the wire path distance being minimized between the first clock point and the second clock point and from the connection point to the drive point;

determining a delay and a load at each cell in the wire path;

moving the connection point on the wire path such that delay and load are substantially equal from the connection point to the first clock point and from the connection point to the second clock point;

connecting the first clock point to the second clock point through the connection point with a wire; and electrically connecting the connection point to the drive point such that skew is minimized between the first clock point and the second clock point from the connection point when a clock signal is provided at the drive point.

8. A method of wire routing comprising the steps of:

providing an array of cells on a semiconductor chip;

determining a minimum distance location between a first clock point, a second clock point and a drive point in the array of cells;

defining and adjusting a wire path to avoid blockages in the array of cells, the wire path distance being minimized between the first clock point and the second clock point and from connection point to the drive point;

determining a delay and a load at each cell in the wire path;

moving the connection point on the wire path such that a delay is substantially equal from the connection point to the first clock point and from the connection point to the second clock point;

connecting the first clock point to the second clock point through the connection point with a wire; and electrically connecting the connection point to the drive point such that skew is minimized between the first clock point and the second clock point from the connection point when a clock signal is provided at the drive point.

9. The method as recited in claim 8 wherein the step of moving the connection point on the wire path such that a delay is substantially equal includes moving the connection point on the wire path such that the delay and a load are substantially equal.

10. The method as recited in claim 8 further comprising the step of adjusting the wire for maximizing balance between load and delay between the first clock point and the second clock point.

11. The method as recited in claim 8 wherein the first clock point and the second clock point include a plurality of clock points and further comprising the step of reducing the number of clock points on the chip by combining the clock points into equivalent clock points.

12. The method as recited in claim 8 further comprises the step of locating the drive point for biasing the location of the wire path.

13. A method of wire routing comprising the steps of:

providing an array of cells on a semiconductor chip;

pairing a first clock point and a second clock point based on substantially equivalent delay and physical proximity therebetween, counting a first number of cells from the first clock point to the second clock point and a second number of cells from the second clock point to the first clock point assigning each cell a first number representing the first number of cells from the first clock point and a second number representing the second number of cells from the second clock point;

selecting a drive point in the array of cells such that a wire path is biased toward the drive point disposed within the array of cells;

counting a third number of cells for each cell representing a distance to both the first clock point and the second clock point from the drive point;

summing the first number, the second number and the third number for each cell to determine a fourth number for each cell;

identifying a minimum distance location based on the cell having the fourth number of lowest value;

defining and adjusting a wire path to avoid blockages in the array of cells, the wire path distance being minimized between the first clock point and the second clock point and from connection point to the drive point;

determining a delay and a load at each cell in the wire path;

moving the connection point on the wire path such that delay and load are substantially equal from the connection point to the first clock point and from the connection point to the second clock point;

connecting the first clock point to the second clock point through the connection point with a wire; and electrically connecting the connection point to the drive point such that skew is minimized between the first clock point and the second clock point from the connection point when a clock signal is provided at the drive point.

14. The method as recited in claim 13 further comprising the step of adjusting the wire for maximizing balance between load and delay between the first clock point and the second clock point.

15. The method as recited in claim 13 wherein the first clock point and the second clock point include a plurality of clock points and further comprising the step of reducing the number of clock points on the chip by combining the clock points into equivalent clock points.

* * * * *